United States Patent
Fujimoto et al.

(10) Patent No.: US 9,847,447 B2
(45) Date of Patent: Dec. 19, 2017

(54) SEMICONDUCTOR LIGHT-EMITTING ELEMENT AND OPTICAL COUPLING DEVICE

(71) Applicant: KABUSHIKI KAISHA TOSHIBA, Tokyo (JP)

(72) Inventors: Kenji Fujimoto, Kanazawa Ishikawa (JP); Takanobu Kamakura, Kitakyushu Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/819,196

(22) Filed: Aug. 5, 2015

(65) Prior Publication Data
US 2016/0064599 A1 Mar. 3, 2016

(30) Foreign Application Priority Data
Sep. 2, 2014 (JP) .................. 2014-178207

(51) Int. Cl.
*H01L 33/06* (2010.01)
*H01L 33/30* (2010.01)
*H01L 25/16* (2006.01)

(52) U.S. Cl.
CPC .......... *H01L 33/06* (2013.01); *H01L 25/167* (2013.01); *H01L 33/30* (2013.01); *H01L 2924/0002* (2013.01)

(58) Field of Classification Search
CPC ....... H01L 33/06; H01L 25/167; H01L 33/10; H01L 33/30; H01L 33/04; H01L 25/157
See application file for complete search history.

(56) References Cited

U.S. PATENT DOCUMENTS 5,216,684 A 6/1993 Wang et al.
5,226,053 A * 7/1993 Cho ................ H01L 33/105
257/E33.069
(Continued)

FOREIGN PATENT DOCUMENTS

JP H04342176 A 11/1992
JP H0537009 A 2/1993
(Continued)

OTHER PUBLICATIONS

"Design and comparison of GaAs, GaAsP and InGaAlAs quantum-well active regions for 808-nm VCSELs" on Jun. 2011 / vol. 19, No. 13 / Optics Express by Zhang.*
"Effect of Quantum Barrier Thickness in the Multiple-Quantum-Well Active Region of GaInN/GaN Light-Emitting Diodes", IEEE Photonics Journal, vol. 5, No. 4, Aug. 2013 by Lin.*
Taiwan Office Action dated Sep. 9, 2016, filed in Taiwan counterpart Application No. 104128913, 8 pages (with translation).
(Continued)

*Primary Examiner* — Moazzam Hossain
*Assistant Examiner* — Farun Lu
(74) *Attorney, Agent, or Firm* — Patterson & Sheridan, LLP

(57) ABSTRACT

A semiconductor light-emitting element includes a semiconductor stacked body that includes a light emitting layer in which n well layers (where n is, for example, an integer of 1 to 10) formed of $In_x(Ga_{1-y}Al_y)_{1-x}As$ ($0<X\leq 0.2$, $0<y<1$), and (n+1) barrier layers formed of $Ga_{1-z}Al_zAs$ ($0<z<1$) and are alternately stacked with the well layer. The light emitting layer in some embodiments can emit light having a peak wavelength in a range of from 700 nm or more to 870 nm or less.

20 Claims, 7 Drawing Sheets

(56) References Cited

U.S. PATENT DOCUMENTS

| | | | |
|---|---|---|---|
| 5,732,098 A * | 3/1998 | Nisitani | H01L 33/30 257/94 |
| 6,144,683 A | 11/2000 | Floyd | |
| 2003/0213950 A1 | 11/2003 | Hwang | |
| 2008/0144683 A1 * | 6/2008 | Nakahara | B82Y 20/00 372/45.01 |
| 2012/0163407 A1 * | 6/2012 | Yang | H01S 5/18313 372/50.11 |
| 2013/0033743 A1 | 2/2013 | Robertson et al. | |

FOREIGN PATENT DOCUMENTS

| | | |
|---|---|---|
| JP | H05160515 A | 6/1993 |
| JP | H09162482 A | 6/1997 |
| JP | 2001060739 A | 3/2001 |
| JP | 2007258399 A | 10/2007 |
| JP | 2011222950 A | 11/2011 |
| JP | 2012199293 A | 10/2012 |
| TW | 201242091 A | 10/2012 |
| TW | I427879 B | 2/2014 |

OTHER PUBLICATIONS

Taiwan Office Action dated Feb. 22, 2017, filed in Taiwan counterpart Application No. 104128913, 9 pages (with translation).

Osamu Tadanaga et al., An 850-nm InAlGaAs Strained Quantum-Well Vertical-Cavity Surface-Emitting Laser Grown on GaAs (311)B Substrate with High-Polarization Stability, IEEE Photonics Technology Letters, US, Aug. 2000, vol. 12, No. 8, p. 942-944.

Yi-An Chang et al., Theoretical and Experimental Analysis on InAlGaAs/AlGaAs Active Region of 850-nm Vertical-Cavity Surface-Emitting Lasers, Journal of Lightwave Technology, US, Jan. 2006, vol. 24, No. 1, p. 536-543.

S. L. Yellen et al., Reliability of InAlGaAs Strained-Quantum-Well Lasers Operating at 0.81mm, IEEE Photonics Technology Letters, US, Aug. 1992, vol. 4, No. 8, p. 329-831.

Japanese Office Action dated May 8, 2017, filed in Japanese counterpart Application No. 2014-178207, 13 pages (with translation).

Chinese Office Action dated Jul. 4, 2017, filed in Chinese counterpart Application No. 2015105534207, 10 pages (with translation).

* cited by examiner

SEMICONDUCTOR LIGHT-EMITTING ELEMENT AND OPTICAL COUPLING DEVICE

CROSS-REFERENCE TO RELATED APPLICATION

This application is based upon and claims the benefit of priority from Japanese Patent Application No. 2014-178207, filed Sep. 2, 2014, the entire contents of which are incorporated herein by reference.

FIELD

Embodiments described herein relate generally to a semiconductor light-emitting element and an optical coupling device.

BACKGROUND

A semiconductor light-emitting element in an optical coupling device typically emits an optical signal at a wavelength in a range of a red to infrared light. A light receiving element in the optical coupler then converts the optical signal into an electric signal. The light receiving element can be, for example, a silicon (Si) photodiode. Therefore, it is possible to transfer a signal between an input terminal and an output terminal that are electrically insulated from each other. Optical coupling devices are widely used in industrial and telecommunication applications.

The red light to the infrared light are emitted from a light emitting layer which is formed of AlGaAs, InGaAlP, or the like. However, in the light emitting layer which is formed of materials including Al, a micro-crystal defect, which is mechanically introduced, or a fine point defect in a hetero-interface, which is introduced when executing an epitaxial growth, becomes a non-light emission center due to stresses generated when the device is operating. These non-light emission centers cause light absorption and become recombination centers, and thus an optical output may be decreased due to the growth and spread of the crystal defect in some cases.

DETAILED DESCRIPTION

In an example embodiment, there is provided a semiconductor light-emitting element in which the growth and spread of the crystal defect in an AlGaAs-based light emitting layer emitting the red light to the infrared light is suppressed. An optical coupling device (optical coupler) incorporating a semiconductor light-emitting element in which the growth and spread of the crystal defect in an AlGaAs-based light emitting layer emitting the red light to the infrared light is suppressed is also described.

In general, according to an example embodiment, a light-emitting element, such as one which might be included in an optical coupler, includes a first semiconductor layer of a first conductivity type (e.g., n-type) on the first semiconductor layer and a second semiconductor of a second conductivity type (e.g., p-type) on the second semiconductor layer. A light emitting layer is disposed between the first and second semiconductor layers. The light emitting layer includes at least one well layer formed of $In_x(Ga_{1-y}Al_y)_{1-x}As$ ($0<x\leq0.2$, $0<y<1$) and at least two barrier layers formed of $Ga_{1-z}Al_zAs$ ($0<z<1$). The at least one well layer is disposed between the at least two barrier layers. The number of well layers may be an integer value n in a range of 1 to 10 and the number of barrier layers may be an integer value n+1 in a range of 2 to 11. In some embodiments, the light emitting layer emits light having a peak wavelength in a range of from 700 nm or more to 870 nm or less.

In general, according to another example embodiment, a semiconductor light-emitting element includes a semiconductor stacked body that includes a light emitting layer having a pseudomorphic quantum well structure in which n well layers (where n is an integer of 1 to 10) formed of $In_x(Ga_{1-y}Al_y)_{1-x}As$ ($0<x\leq0.2$, $0<y<1$) by adding a small amount of In to a AlGaAs-base layer, and (n+1) barrier layers formed of $Ga_{1-z}Al_zAs$ ($0<z<1$) and are alternately stacked with the well layer, in which the light emitting layer emits light having a peak wavelength of from 700 nm or more to 870 nm or less. Hereinafter, the description is given of an example embodiment with reference to the drawings.

Figure 1A:
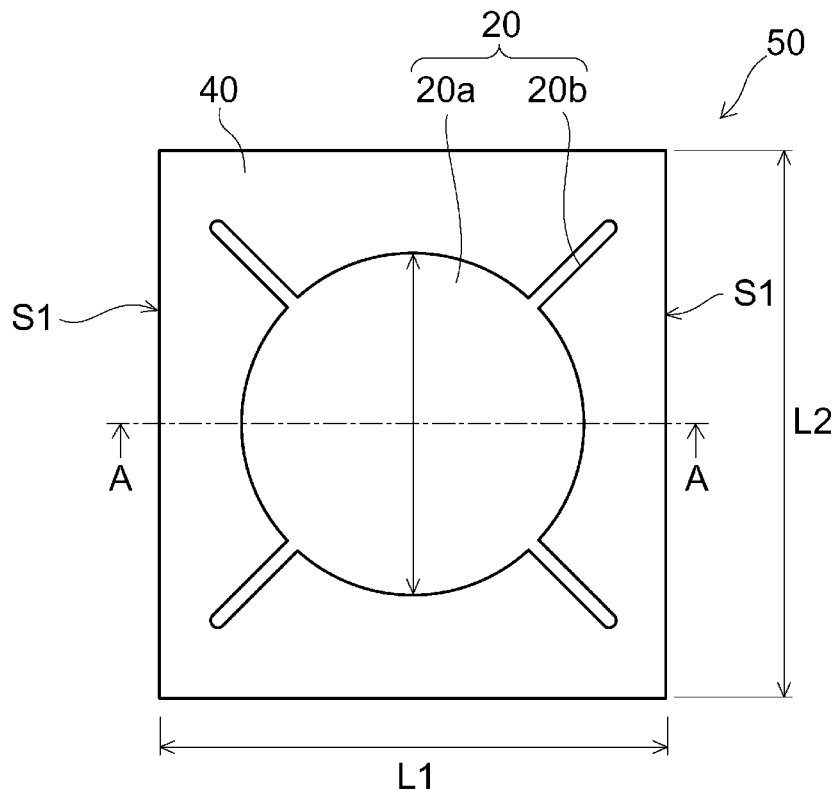
FIG. 1A is a schematic plan view of a semiconductor light-emitting element according to a first embodiment.
Figure 1B:
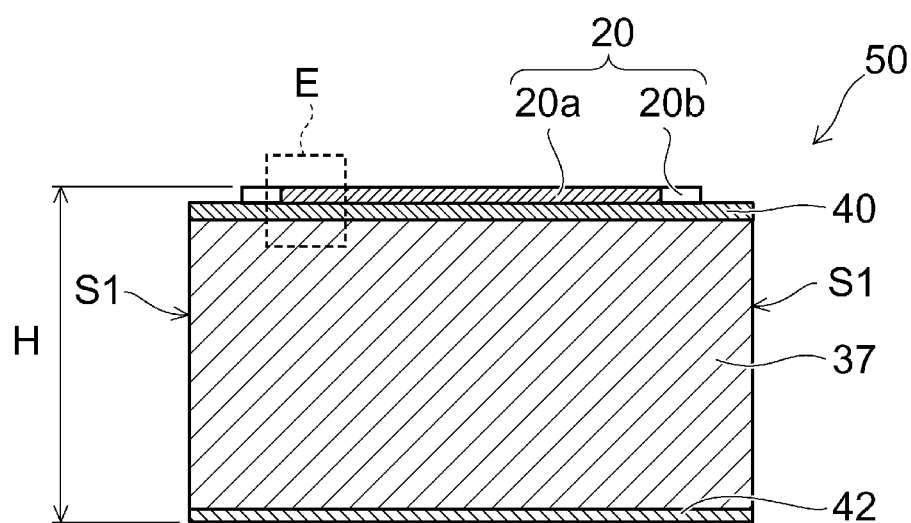
FIG. 1B is a schematic cross-sectional view taken along ling A-A.

FIG. 1A is a schematic plan view of a semiconductor light-emitting element according to a first embodiment, and FIG. 1B is a schematic cross-sectional view taken along ling A-A.

The semiconductor light-emitting element 50 includes a semiconductor substrate 37, a semiconductor stacked body 40 which is provided on the semiconductor substrate 37 and includes a light emitting layer 25, a first electrode 20, and a second electrode 42.

The first electrode 20 includes a circular pad 20a. In addition, the first electrode 20 may further include a linear projection portion 20b in the direction of a diagonal line of a chip. That is, a projection portion 20b may extend from circular pad 20a towards a corner of light emitting element 50. With this configuration, in a plan view, it is possible to increase an optical output by emitting light in a wide area of the light emitting layer 25.

The second electrode 42 is provided on a rear surface of the semiconductor substrate 37.

Meanwhile, a crystal growth surface of the semiconductor substrate 37 may be set to a surface inclined from a low order crystal surface by, for example, 3 degrees to 20 degrees. By using an inclined substrate, it is possible to easily and efficiently dope the semiconductor stacked body 40 with impurities, thereby improving optical characteristics.

A length L1 of a side in a horizontal direction and a length L2 of a side in a vertical direction of a chip size may be independently set to values between 150 μm to 250 μm. In addition, a height H of the chip may be set as 100 μm to 170 μm. This aspect ratio (H/L) is used when element isolation is performed by a scribing method, but when element isolation is performed by a dicing method, the height H of the chip may be set as 50 μm as long as the mechanical strength of the chip is sufficient.

Figure 2A:
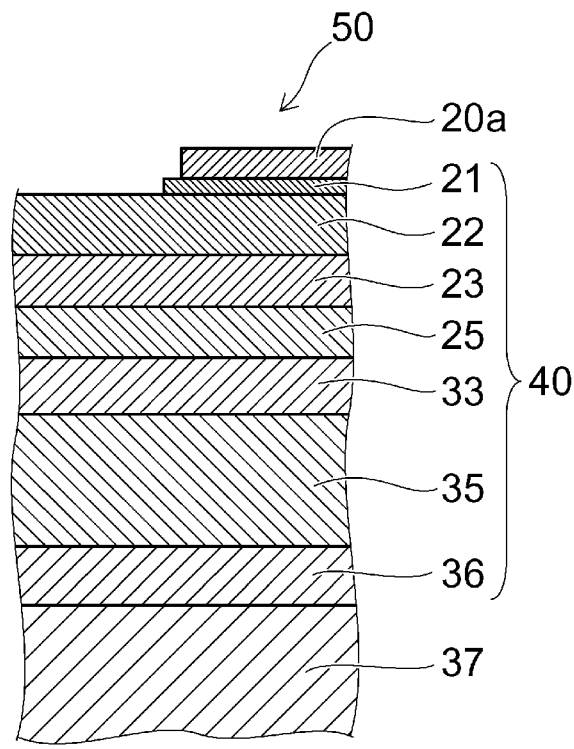
FIG. 2A is a schematic cross-sectional view of an enlarged E portion of a semiconductor stacked body.
Figure 2B:
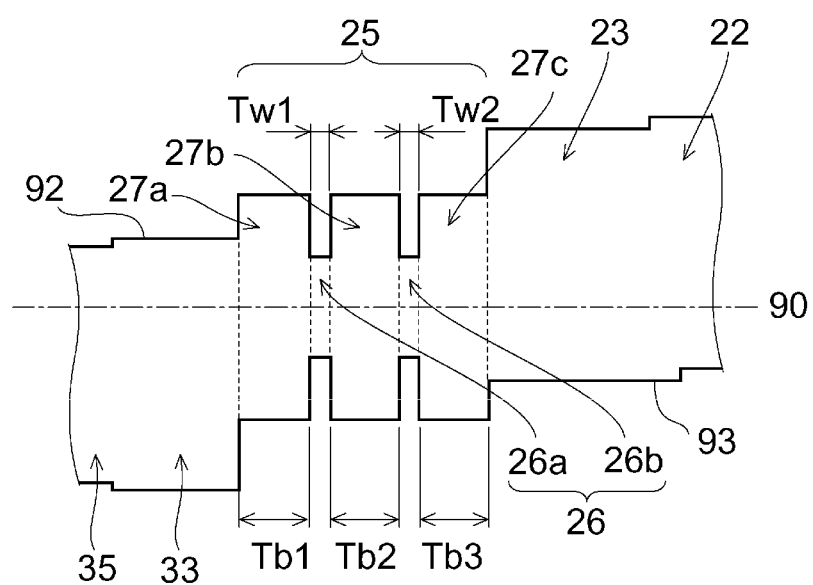
FIG. 2B is a band diagram of a quantum well structure.

FIG. 2A is a schematic cross-sectional view of an enlarged E portion of a semiconductor stacked body, and FIG. 2B is a band diagram of a quantum well structure.

The semiconductor stacked body 40 includes the light emitting layer 25. In addition, the light emitting layer 25 includes a quantum well structure which is configured to include a number (n) of well layers 26 of (where n is an integer of 1 or more) and a number (n+1) of barrier layers 27, which are alternately stacked with the well layers 26. The light emitted from the light emitting layer 25 has a peak emission wavelength in a range of 700 nm to 870 nm.

In addition, the semiconductor substrate 37 is formed of, for example, an n-type GaAs, and a donor concentration is set as $1\times10^{18}$ cm$^{-3}$. The semiconductor stacked body 40 includes, from the semiconductor substrate 37 side, a buffer layer 36, a reflecting layer 35, an n-type cladding layer 33, the light emitting layer 25, a p-type cladding layer 23, a p-type current diffusion layer 22, and a p-type contact layer 21. The semiconductor stacked body 40 may be formed by using, for example, a metal organic chemical vapor deposition (MOCVD) method or a molecular beam epitaxy (MBE) method.

The buffer layer 36 is formed of GaAs or the like, and the thickness and the donor concentration thereof may be respectively set as 0.5 μm and $5\times10^{17}$ cm$^{-3}$. The reflecting layer 35 may be, for example, a Bragg reflector obtained by stacking twenty pairs of $In_{0.5}Al_{0.5}P$ and $Al_{0.2}Ga_{0.8}As$ layers. If the reflecting layer 35 is provided, it is possible to improve light extraction efficiency by causing the light which is downwardly emitted to be reflected towards the light emission surface above.

The n-type cladding layer 33 is formed of an $In_{0.5}(Ga_{0.4}Al_{0.6})_{0.5}P$ or the like, and the thickness and the donor concentration thereof may be respectively set as, for example, 0.6 μm and $1\times10^{18}$ cm$^{-3}$. The p-type cladding layer 23 is formed of an $In_{0.5}(Ga_{0.4}Al_{4.6})_{0.5}P$ or the like, the thickness and an acceptor concentration thereof may be respectively set as, for example, 0.6 μm and $8\times10^{17}$ cm$^{-3}$.

In addition, the p-type current diffusion layer 22 is formed of $Al_{0.6}Ga_{0.4}As$ or the like, the thickness and the acceptor concentration thereof may be respectively set as, for example, 2.5 μm and $2\times10^{18}$ cm$^{-3}$. The p-type contact layer 21 is formed of the GaAs, the thickness and the acceptor concentration thereof may be respectively set as, for example, 0.01 μm and $2\times10^{18}$ cm$^{-3}$. Note that, the conductivity types of the various layers may be reversed with respect to each other, and the material, the impurity concentration, and the thickness of the layer are not affected by the conductivity types of the respective layers.

In addition, the light emitting layer 25 includes well layer (s) 26 and barrier layers 27. The well layer 26 is formed of $In_x(Ga_{1-y}Al_y)_{1-x}As$ (0<x≤0.2, 0<y<1), and the thickness of a first layer is set as, for example, equal to or less than 11 nm in a non-doped state. In addition, the barrier layer 27 is formed of $Al_zGa_{1-z}As$ (0≤z≤1), and the thickness of the first layer is set as, for example, greater than 10 nm and equal to or less than 50 nm in the non-doped state.

FIG. 2B is a band diagram of a quantum well structure in which the number n of the well layers 26 is two (n=2) and the number (n+1) of the barrier layers 27 stacked with the well layers 26 therebetween is three. A conduction band 92 and a valence band 93 are illustrated in accordance with a quasi Fermi level 90. An electron and a hole are in each of two well layers 26a and 26b. If the thicknesses Tb1, Tb2, and Tb3 of the barrier layers 27a, 27b, and 27c are small, the quantum efficiency becomes improved. However, since the carriers are in a thin area between the p-type cladding layer 23 and the n-type cladding layer 33, junction capacitance becomes greater.

On the other hand, if the thicknesses Tb1, Tb2, and Tb3 of the barrier layers 27a, 27b, and 27c are large, since the carriers would be in a thick area between the p-type cladding layer 23 and the n-type cladding layer 33, the junction capacitance becomes less.

Figure 3:
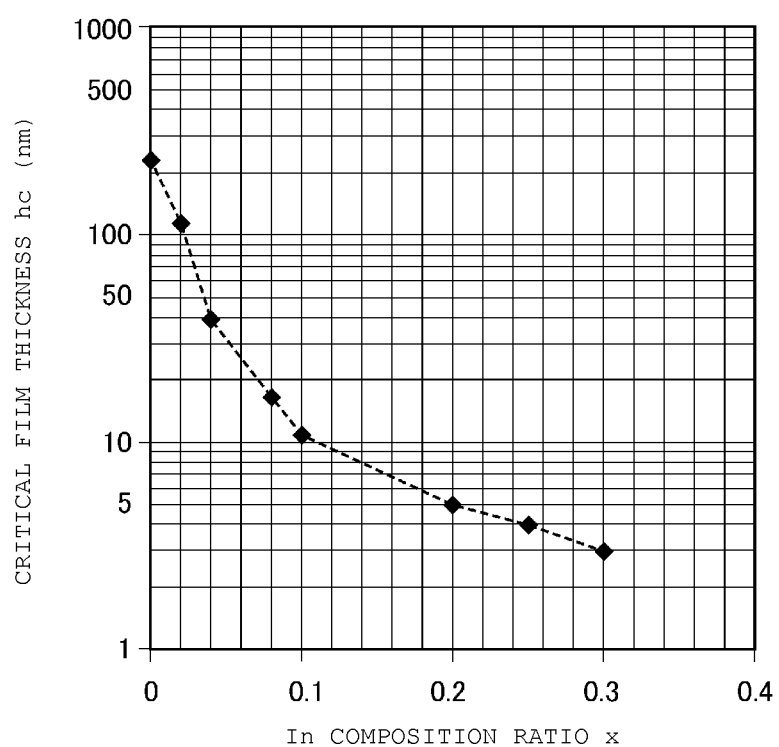
FIG. 3 is a graph illustrating a critical film thickness dependency with respect to an In composition ratio.

FIG. 3 is a graph illustrating an example of a calculation result of a critical film thickness dependency with respect to an In composition ratio of the well layer obtained by setting an Al composition ratio of the barrier layer to be 0.5 in a structure as illustrated in FIG. 2B. A vertical axis represents a critical film thickness hc (nm), and a horizontal axis represents the In composition ratio (%). Even if a lattice constant of the well layer 26 and a lattice constant of the barrier layer 27 are not matched with each other, since the respective layers are thin, if the value of constant is the critical film thickness or less by being strained in a range of an elastic limit, crystallinity is satisfactorily maintained regardless of lattice matching conditions. Here, if x>0.2 is satisfied, in the structure as illustrated in FIG. 2B, compression or a tensile stress generated by a difference in the linear expansion coefficients of the respective materials, which is caused by a difference between an epitaxial growth temperature and a room temperature, and the thickness of each layer exceed the elastic limit. Therefore, when the In composition ratio x of the well layer 26 is set as 0.2 and the film thickness is set as 5 nm, the crystalline structure of the layer is degraded, and the calculation result is substantially matched with the degradation of the crystalline structure in a plurality of actual heteroepitaxial growths. Therefore, a structure in which the film thickness exceeds the critical value is not preferable since the crystallinity is remarkably decreased.

That is, the critical film thickness hc is decreased and the upper limit of the thickness of the well layer 26 is restricted in accordance with an increase in the In composition ratio x. Meanwhile, when the barrier layer 27 is formed of $Al_zGa_{1-z}As$ (0<z<1), the well layer 26 has the lattice constant greater than that of the barrier layer 27. For this reason, a compressive stress applied to the well layer 26 along with the growth surface, and a tensile stress is applied to the barrier layer 27 along with the growth surface. The critical film thickness hc (represented by a mark ♦ in FIG. 3) is calculated based on the Matthews Equation (Equation 1).

$$hc = \frac{b}{2\pi f} \frac{(1-\nu\cos^2\alpha)}{(1+\nu)\cos\lambda}\left(\ln\frac{hc}{b}+1\right) \quad \text{Equation 1}$$

Here, b: Burgers vector of dislocation
ν: Poisson's ratio
f: Degree of lattice mismatching
α: Angle formed by dislocation line and Burgers vector λ: Angle formed by slip plane and interface For example, when the In composition ratio x is 0.2, the critical film thickness hc becomes approximately 5 nm, and thus the thicknesses Tw1 and Tw2 of the well layer 26 may be set as 5 nm or less. In addition, if the In composition ratio x is set as 0.1, the critical film thickness hc becomes approximately 11 nm, and thus the thicknesses Tw1 and Tw2 of the well layer 26 may be set as 11 nm or less. Since the lattice constant becomes greater in accordance with the In composition ratio x, the critical film thickness hc which is lattice-relaxed is decreased. However, in a case of the plurality of heteroepitaxial growth films, since there is a difference between the calculated value and satisfactory crystallizing conditions in the actual device structure, it is not possible to obtain the satisfactory crystalline structure if the film thickness is not about a half of the critical film thickness hc. That is, when the In composition ratio x is 0.1, the critical film thickness is required to be approximately 5 nm. Moreover, when the In composition is 0, the critical film thickness is calculated as 200 nm, and even with the well layer having the thickness of 5 nm which is further smaller than the realistically possible thickness of 100 nm, the growth and spread of the crystal defect may be caused through the conductivity. Thus, there is a problem in that the device is degraded by the growth and spread of the crystal defect—that is, the reliability of the device is degraded.

Next, a relationship of long-term reliability of the semiconductor light-emitting element and the strain of the quantum well structure will be described.

Figure 4A:
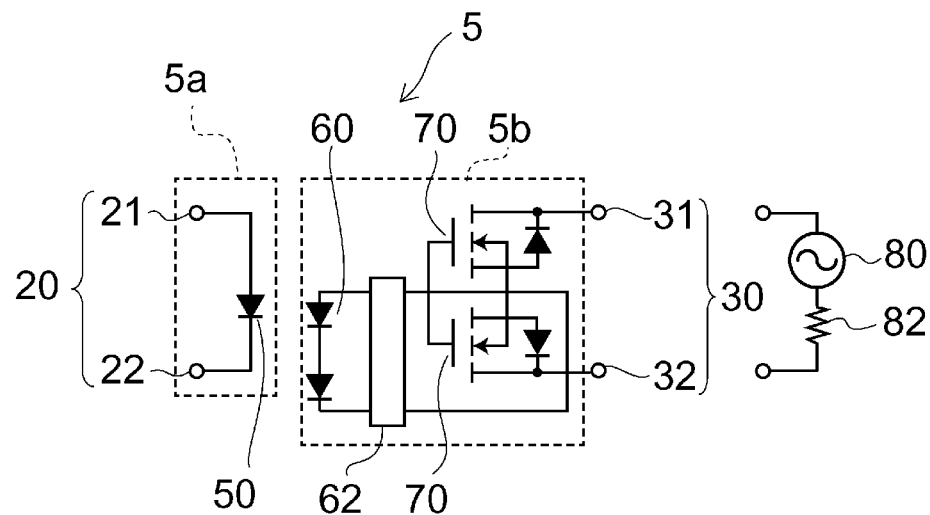
FIG. 4A is a configuration diagram of an application example of an optical coupling device according to the first embodiment.
Figure 4B:
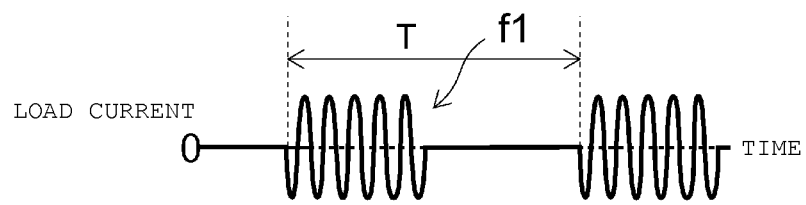
FIG. 4B is a waveform chart of a load current of the optical coupling device.
Figure 4C:
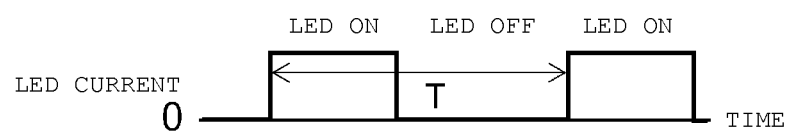
FIG. 4C is a waveform chart of the driving pulse current of a light-emitting element.

FIG. 4A is a configuration diagram of an example of an optical coupling device according to the first embodiment, FIG. 4B is a waveform chart of a current which flows in a load of the optical coupling device, and FIG. 4C is a waveform chart of the current of a driving pulse of a light-emitting element.

The optical coupling device 5 which is illustrated in FIG. 4A includes a light emitting portion 5a and a light receiving portion 5b. The light emitting portion 5a includes the light-emitting element 50 according to the first embodiment. The light receiving portion 5b includes a light receiving element 60, a control circuit 62, and an N-channel MOSFET 70 which is connected to a common-source.

The optical coupling device 5 is connected to, for example, an AC generator 80 and a load 82. A frequency f1 of the AC generator 80 is set as, for example, 100 kHz. When the light-emitting element 50 is turned on, the light receiving element 60 generates a photo electromotive force by the light emitted from the light-emitting element 50. During a plus (+) period of an output terminal 31, the current flows from an output terminal 32 to the load 82, and the AC generator by passing through from the output terminal 31 of the optical coupling device 5 to the MOSFET 70. During a minus (−) period of the output terminal 31, the current flows in the direction opposite to the above. Therefore, as illustrated in FIG. 4B, an alternating current, of which the frequency is f1, flows into the load 82. That is, the optical coupling device 5 switches the light-emitting element 50 on or off in accordance with a driving signal, and operates as a photo relay which switches an alternating load current on or off.

Meanwhile, the light receiving portion 5b of the optical coupling device 5 may include at least the light receiving element 60. A semiconductor light receiving element may be a photodiode, a phototransistor, light reception IC, or the like which is formed of, for example, Si, Ge, or InGaAs, and outputs an optical current corresponding to an input electric signal.

In an optical data link or the like which transmits and receives a high speed digital signal, if the repetitive frequency of a pulse is in a range of, for example, 5 MHz to 50 MHz, the period thereof is short, for example, 0.02 µs to 0.2 µs. On the other hand, when the optical coupling device 5 is applied to a high-speed semiconductor tester instead of a mechanical relay, as illustrated in FIG. 4C, if the repetitive frequency of the pulse driving the light-emitting element 50 is, for example, 1 kHz to 10 kHz, the period T becomes longer, for example, 0.1 ms to 1 ms. That is, the time during which the light-emitting element 50 is turned on becomes longer. In this case, the light-emitting element 50 is required to be such that its optical output does not decrease over the long period of operation (ON-state) even in the pulse driving of the long period T. For this reason, the light emitting layer 25 of the light-emitting element 50 may be the light-emitting element including the pseudomorphic quantum well structure as described above.

Figure 5A:
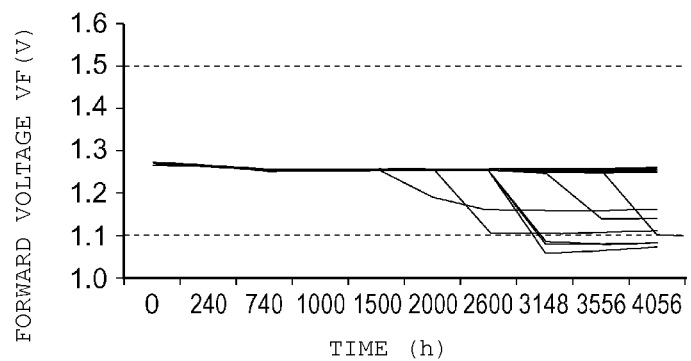
FIGS. 5A to 5F are graphs illustrating operational test results of the optical coupling device under various conditions including high-temperature and high-humidity conditions.
Figure 5B:
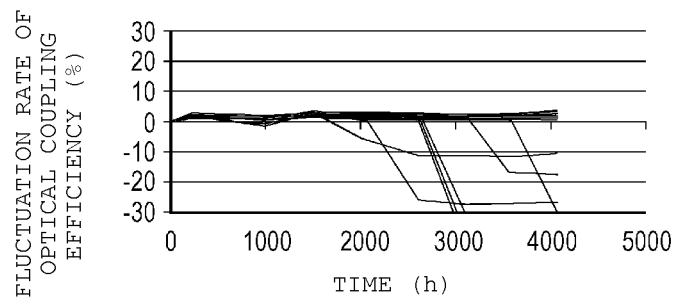
Figure 5C:
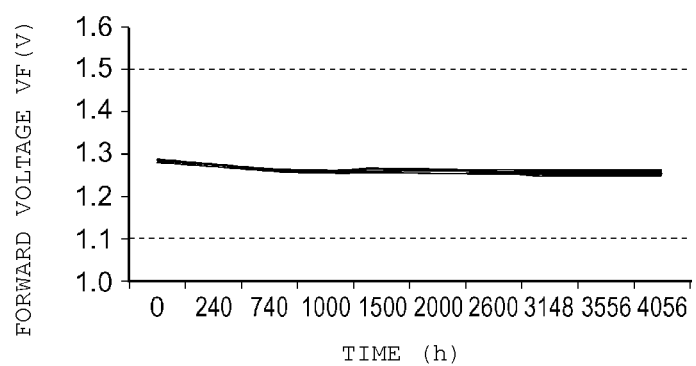
Figure 5D:
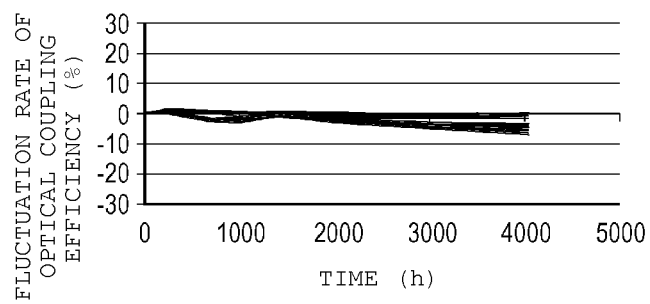
Figure 5E:
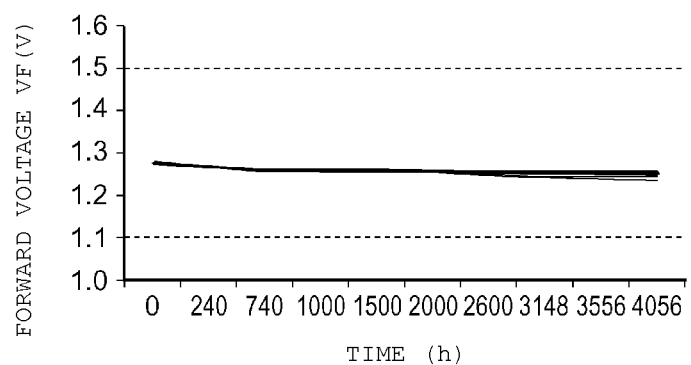
Figure 5F:
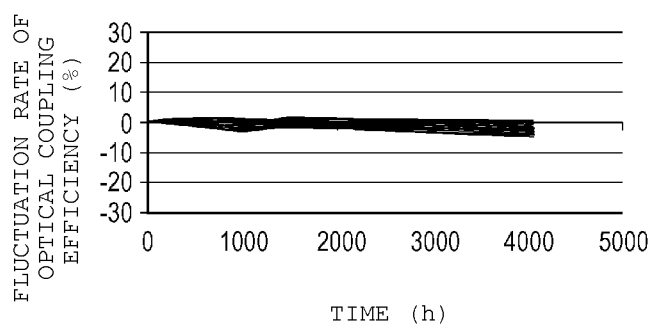

FIGS. 5A to 5F are graphs illustrating a result of an operational test of several optical coupling devices under high-temperature and high-humidity conditions. That is, FIG. 5A illustrates a forward voltage dependency with respect to a galvanization time in a case of several optical coupling devices having the In composition ratio of x=0, FIG. 5B illustrates a optical coupling efficiency dependency in a case of In composition ratio being x=0, FIG. 5C illustrates the forward voltage dependency of several optical coupling devices with respect to the galvanization time in a case of several optical coupling devices having the In composition ratio of x=0.04. FIG. 5D illustrates the optical coupling efficiency dependency in a case of x=0.04. FIG. 5E illustrates the forward voltage dependency with respect to the galvanization time in a case of x=0.08, and FIG. 5F illustrates the optical coupling efficiency dependency in a case of x=0.08. FIGS. 5A to 5F illustrate test results on devices having the thickness of the barrier layer in the element set to 15 nm, an Al composition ratio z is set as 0.5, the thickness of the well layer 26 is set to 5 nm, and the In composition ratio x is changed as noted above.

In addition, in FIGS. 5A, 5C, and 5D, the vertical axis represents a forward direction voltage (V) when the forward current of the light-emitting element is 10 mA, and the horizontal axis represents a time (h). Further, in FIGS. 5B, 5D, and 5F, the vertical axis represents a fluctuation rate of the optical coupling efficiency, and the horizontal axis represents the time (h).

The operational tests of the optical coupling device under high temperature and high humidity is executed by using a galvanization method in such a manner that a temperature is set as 85° C., the humidity is set as 85%, and the operation current of the light-emitting element 50 is set as 10 mA.

The light-emitting element 50 includes the crystal defect such as dislocation which is generated on an edge surface (represented by 51 in FIGS. 1A and 1B) by cleavage or the like. When the operation is continued in the long period of pulse equal to or longer than 0.5 ms, the energy caused by the non-emitting recombination increases the lattice vibration or the like, whereby existing dislocations are more likely to be increased. In particular, when a DC operation is performed at a high temperature, the crystal defect is increased in a chain reaction. Therefore, such facet degradation is generated and thus, the optical output is likely to be decreased.

In FIGS. 5A and 5B, the well layer of the light-emitting element is formed of $Ga_{0.94}Al_{0.06}As$ (without including any In), and the thickness of one of the well layers is set as 5 nm. In addition, the barrier layer is formed of $Al_{0.5}Ga_{0.5}As$, and the thickness thereof is set as 15 nm. If the conduction time exceeds 1500 hours, the light-emitting element in which the forward direction voltage VF is suddenly decreased (that is, the optical output is decreased due to an increase in the crystal defect) is generated, and thus the optical coupling efficiency is suddenly degraded. In this case, even though a lattice mismatching rate of the well layer with respect to the GaAs is small, for example, approximately 0.0001, the optical coupling efficiency is suddenly degraded. That is, even though the In combination ratio x is 0 and the critical film thickness is effectively 5 nm, the growth and spread of the crystal defect occur and the reliability is rapidly degraded—that is, the device effectively fails. When analyzing the element, the crystal defect is spread, as a dendrite, from a scribe trace of an edge of the element to the inside of the chip, and the crystal defect which penetrates the edge of the element along the crystal orientation may be seen. The crystal defect which is spread focusing on the well layer of the light emitting layer is observed. Similarly, the similar crystal defect which is introduced and spread in the same way is observed from an impression on the surface causing damage when executing a ball bonding process.

On the other hand, in FIG. 5C and FIG. 5D, the well layer of the light-emitting element 50 is formed of $In_{0.04}(Ga_{0.94}Al_{0.96})_{0.96}As$, and the thickness thereof is set as 5 nm. In addition, the barrier layer is formed of $Al_{0.5}Ga_{0.5}As$ and the thickness thereof is set as 15 nm. At this time, even when the galvanization time becomes 4056 hours long, the light-emitting element 50 in which the forward direction voltage VF is suddenly decreased is not generated, and the optical coupling efficiency is less likely to be degraded. For example, in FIG. 5D, the fluctuation rate of the optical coupling efficiency remains in a range of 0% to −8% when the galvanization time is 4000 hours.

In addition, in FIGS. 5E and 5F, the well layer 26 of the light-emitting element 50 is formed of $In_{0.08}(Ga_{0.94}Al_{0.06})_{0.92}As$, and the thickness thereof is set as 5 nm. Further, the barrier layer is formed of $Al_{0.5}Ga_{0.5}As$, and the thickness thereof is set as 15 nm. At this time, even when the conduction time is 4056 hours long, the light-emitting element in which the forward direction voltage is suddenly reduced is not generated, and the optical coupling efficiency is less likely to be degraded. For example, in FIG. 5F, the fluctuation rate of the optical coupling efficiency remains in a range of 0% to −6% when the galvanization time is 4000 hours.

That is, by setting the In composition ratio x as 0 or greater and 0.2 or less, it is possible to prevent the light-emitting element 50 from being suddenly degraded, and prevent the optical coupling efficiency of the optical coupling device 5 from being degraded. By adding a small amount of In to the AlGaAs-based well layer, it is possible to prevent the crystal defect from being introduced and spread, and the range thereof is the film thickness which does not exceed the critical film thickness with respect to the increase in the lattice constant in accordance with the increase in the In composition ratio x, thereby obtaining satisfactory element characteristics in the above-described film thickness. The critical film thickness is the critical film thickness hc which is generally calculated or less and satisfactory device characteristics may be obtained by not exceeding the half of the plate thickness. In addition, in the MOCVD method, the control of the In composition ratio is executed by a flow increasing a gas flow of TM1 (trimethyl indium), but in consideration that the controllability is several tenths of a percent and a flow amount of TMI with respect to a flow amount of the entire layers is small, a composition control ratio is realistically 2% to 4%. Accordingly, it is more preferable that the In composition ratio x is set as 0.02 or greater since the In composition ratio x in the crystal growth may be stably controlled and the yield of the semiconductor light-emitting element may be stabilized.

That is, when a mixed crystal which is formed of $In_x(Ga_{1-y}Al_y)_{1-x}As$ is subjected to the crystal growth by using the MOCVD method, for example, a hydrogen gas is gasified by passing through the inside of the TMI which is formed into a powder shape or granular shape at a high temperature with a concentration in response to the saturated aqueous vapor (sublimation). In this case, control accuracy of a mass flow controller which controls the amount of gas flow, and the flow rate of the TMI flowing for obtaining other MO gases and the proper III/V rate are extremely small and thus have limitations. For this reason, it is preferable that the lower limit value of the In composition ratio x is set as 0.02.

As described above, FIGS. 5C, 5D, 5E, and 5F illustrate that the compressive stress is properly applied to the well layer 26 and the tensile stress is properly applied to the barrier layer 27, physical properties are changed by adding the In to Al and Ga, the In atoms execute the pinning of spread of the crystal defect in such a manner as to suppress the increase in the crystal defect, and the optical output is prevented from being degraded.

In addition, in this case, by introducing the compressive strain to the well layer 26, the effective mass of the hole is decreased and thus it is easy to uniformly execute the hole injection. Further, an electron of carrier confinement potential may be increased and a hole of carrier confinement potential may be decreased. Due to this, it is easy to suppress the overflow of the electron. As a result, it is considered that, for example, by preventing the non-emitting recombination, the lattice vibration energy is reduced and the increase in the crystal defect is suppressed.

Figure 6:
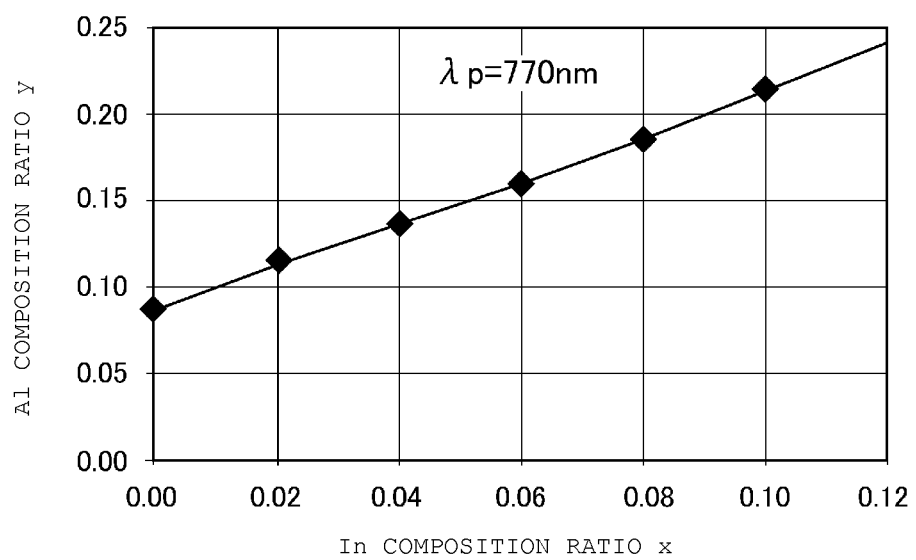
FIG. 6 is a graph illustrating a relationship between the In composition ratio and an Al composition ratio of a well layer capable of emitting light at the wavelength of 770 nm.

FIG. 6 is a graph illustrating a relationship between the In composition ratio and an Al composition ratio of a well layer capable of emitting light of the wavelength of 770 nm. The vertical axis represents an Al composition ratio y, and the horizontal axis represents the In composition ratio x. Meanwhile, the number of the well layers 26 is two and the thicknesses Tw1 and Tw2 are set as 5 nm. In addition, the number of the barrier layers 27 is three and the thicknesses Tb1, Tb2, and Tb3 are set as 15 nm. For example, when the wavelength is set as 770 nm, if the In composition ratio x is set as 0 or greater and 0.10 or less, the Al composition ratio y may be set as 0.085 or greater and 0.214 or less.

In the barrier layer 27 which is formed of $Al_zGa_{1-z}As$, when the Al composition ratio z is set to be small, a barrier difference becomes small and a carrier overflow is likely to be generated, and thus the lower limit of z is set as, for example, 0.3. In addition, when the Al composition ratio z is set to be large, the barrier difference becomes greater and the forward direction voltage VF is increased, and thus the upper limit of Z is set as, for example, 0.7.

The light-emitting element in which the growth of the crystal defect is suppressed is provided according to the exemplary embodiment. Further, the optical coupling device which includes such a light-emitting element may prevent the optical coupling efficiency from being degraded even though the time during which the semiconductor light-emitting element is turned on is long. For this reason, the optical coupling device may be used to the high-speed semiconductor tester as the photo relay.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting element, comprising:
a semiconductor substrate;
a first electrode on a first side of the semiconductor substrate, the first electrode comprising a circular pad above a central portion of the semiconductor substrate;
a second electrode on a second side of the semiconductor substrate opposite the first side;
a first semiconductor layer of a first conductivity type between the semiconductor substrate and the first electrode;
a second semiconductor layer of a second conductivity type between the first semiconductor layer and the first electrode; and
a light emitting layer between the first and second semiconductor layers, the light emitting layer including a well layer formed of $In_x(Ga_{1-y}Al_y)_{1-x}As$ ($0<x\leq0.1$, $0<y<1$), and two barrier layers formed of $Ga_{1-z}Al_zAs$ ($0<z<1$), wherein the well layer is between the two barrier layers, wherein
the light emitting layer has a forward direction voltage that does not decrease by more than 8% from an initial forward voltage level during a 4000 hour galvanization test at 85° C. and 85% humidity with 10 mA operation current.

2. The semiconductor light-emitting element according to claim 1, wherein
a thickness of the well layer is 11 nm or less, and
a thickness of each of the two barrier layers is 10 nm or more and 50 nm or less.

3. The semiconductor light-emitting element according to claim 2, wherein x is greater than or equal to 0.02 and less than or equal to 0.1.

4. The semiconductor light-emitting element according to claim 2, wherein x is greater than or equal to 0.04 and less than or equal to 0.1.

5. The semiconductor light-emitting element according to claim 1, wherein x is greater than or equal to 0.02 and less than or equal to 0.1.

6. The semiconductor light-emitting element according to claim 1, wherein x is greater than or equal to 0.04 and less than or equal to 0.1.

7. The semiconductor light-emitting element according to claim 1, further comprising:
a Bragg reflector configured to reflect light emitted from the light emitting layer, the first semiconductor layer being between the Bragg reflector and the light emitting layer.

8. The semiconductor light-emitting element according to claim 1, wherein
the light emitting layer comprises a number n of well layers formed of $In_x(Ga_{1-y}Al_y)_{1-x}As$ ($0<x\leq0.1$, $0<y<1$),
the light emitting layer comprises a number n+1 of barrier layers formed of $Ga_{1-z}Al_zAs$ ($0<z<1$), and
the well layers and the barrier layers are stacked in an alternating manner with each other, and
n is an integer less or equal to 10 and equal to or greater than 1.

9. The semiconductor light-emitting element according to claim 8, wherein
each well layer has a thickness that is 11 nm or less, and
each barrier layer has a thickness that is 10 nm or more and 50 nm or less.

10. The semiconductor light-emitting element according to claim 9, wherein x is greater than or equal to 0.02 and less than or equal to 0.1.

11. The semiconductor light-emitting element according to claim 9, wherein x is greater than or equal to 0.04 and less than or equal to 0.1.

12. The semiconductor light-emitting element according to claim 1, further comprising:
a buffer layer on a semiconductor substrate, the buffer layer formed of GaAs, the first semiconductor layer contacting the buffer layer;
a third semiconductor layer of the second conductivity type on the second semiconductor layer; and
a fourth semiconductor layer of the second conductivity type on the third semiconductor layer, the fourth semiconductor layer have an impurity concentration that is greater than an impurity concentration of the third semiconductor layer.

13. The semiconductor light-emitting element according to claim 1, wherein the light emitting layer emits light having a peak wavelength that is in a range of 700 nm or more to 870 nm or less.

14. A light-emitting element, comprising:
a semiconductor substrate;
a first electrode on a first side of the semiconductor substrate, the first electrode comprising a circular pad above a central portion of the semiconductor substrate;
a second electrode on a second side of the semiconductor substrate opposite the first side;
a buffer layer between the semiconductor substrate and the first electrode;
a first semiconductor layer of a first conductivity type between the buffer layer and the first electrode;
a second semiconductor layer of a second conductivity type between the first semiconductor layer and the first electrode;
a light emitting layer disposed between the first and second semiconductor layers, the first and second semiconductor layers being of opposite conductivity types, the light emitting layer comprising:
n well layers formed of $In_x(Ga_{1-y}Al_y)_{1-x}As$ ($0<x\leq0.1$, $0<y<1$), where n is the number of well layers in the light emitting layer,
n+1 barrier layers formed of $Ga_{1-z}Al_zAs$ ($0<z<1$), where n+1 is the number of barrier layers in the light emitting layer, and
n is an integer that is greater than or equal to 1 and less than or equal to 10, wherein
the light emitting layer has a forward direction voltage that does not decrease by more than 8% from an initial forward voltage level during a 4000 hour galvanization test at 85° C. and 85% humidity with 10 mA operation current.

15. The light-emitting element according to claim 14, wherein
a thickness of each well layer is 11 nm or less, and
a thickness of each barrier layer is 10 nm or more and 50 nm or less.

16. The light-emitting element according to claim 15, wherein x is greater than or equal to 0.02 and less than or equal to 0.1.

17. The light-emitting element according to claim 15, wherein x is greater than or equal to 0.04 and less than or equal to 0.1.

18. An optical coupler, comprising:
- a light-receiving element outputting an electrical signal according to a light signal output by a light-emitting element, the light-emitting element including:
- a first semiconductor layer of a first conductivity type;
- a second semiconductor of a second conductivity type on the first semiconductor layer; and
- a light emitting layer between the first and second semiconductor layers, the light emitting layer including a well layer formed of $In_x(Ga_{1-y}Al_y)_{1-x}As$ ($0<x\leq0.1$, $0<y<1$), and two barrier layers formed of $Ga_{1-z}Al_zAs$ ($0<z<1$), wherein the well layer is between the two barrier layers, wherein
- the optical coupler has an optical coupling efficiency that does not decrease by more than 8% during a 4000 hour galvanization test at 85° C. and 85% humidity with 10 mA operation current supplied to the light emitting layer.

19. The optical coupler according to claim 18, wherein the light emitting layer comprises:
- n well layers formed of $In_x(Ga_{1-y}Al_y)_{1-x}As$ ($0<x\leq0.1$, $0<y<1$), where n is the number of well layers in the light emitting layer,
- n+1 of barrier layers formed of $Ga_{1-z}Al_zAs$ ($0<z<1$), where n+1 is the number of barrier layers in the light emitting layer,
- n is an integer that is greater than or equal to 1 and less than or equal to 10, and
- the well layers and the barrier layers are stacked in an alternating manner with each other.

20. The optical coupler according to claim 19, wherein a thickness of each well layer is 11 nm or less, and a thickness of each barrier layer is 10 nm or more and 50 nm or less.

* * * * *